(12) United States Patent
Liu et al.

(10) Patent No.: US 10,578,969 B2
(45) Date of Patent: Mar. 3, 2020

(54) PHOTORESIST TOPCOAT COMPOSITIONS AND METHODS OF PROCESSING PHOTORESIST COMPOSITIONS

(71) Applicant: Rohm and Haas Electronic Materials LLC, Marlborough, MA (US)

(72) Inventors: Cong Liu, Shrewsbury, MA (US); Doris H. Kang, Shrewsbury, MA (US); Deyan Wang, Hudson, MA (US); Cheng-Bai Xu, Southborough, MA (US); Mingqi Li, Shrewsbury, MA (US); Irvinder Kaur, Northborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 16/245,631

(22) Filed: Jan. 11, 2019

(65) Prior Publication Data
US 2019/0235385 A1   Aug. 1, 2019

Related U.S. Application Data

(63) Continuation of application No. 15/730,875, filed on Oct. 12, 2017, now Pat. No. 10,197,918.
(Continued)

(51) Int. Cl.
  *G03F 7/11*   (2006.01)
  *G03F 7/09*   (2006.01)
  (Continued)

(52) U.S. Cl.
  CPC ............... *G03F 7/11* (2013.01); *B05C 11/08* (2013.01); *G03F 7/0005* (2013.01);
  (Continued)

(58) Field of Classification Search
  CPC ... G03F 7/004; G03F 7/11; G03F 7/38; G03F 7/40; H01L 21/0274
  (Continued)

(56) References Cited

U.S. PATENT DOCUMENTS 8,241,832 B2   8/2012  Wang
8,440,387 B2   5/2013  Allen
(Continued)

FOREIGN PATENT DOCUMENTS

CN    104448107 A    3/2015

OTHER PUBLICATIONS

Search report for Taiwan Application No. 105114263 dated Sep. 9, 2016.
(Continued)

*Primary Examiner* — Amanda C. Walke

(74) *Attorney, Agent, or Firm* — Jonathan D. Baskin

(57) ABSTRACT

Photoresist topcoat compositions, comprising: a first polymer comprising a first repeat unit of general formula (I) and a second repeat unit of general formula (II):

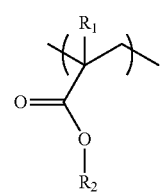

(I)

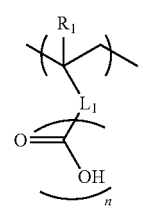

(II)

wherein: $R_1$ independently represents H, F or optionally fluorinated C1 to C4 alkyl; $R_2$ represents optionally fluorinated linear, branched or cyclic C1 to C20 alkyl; $L_1$ represents a single bond or a multivalent linking group; and n is an integer of from 1 to 5; a second polymer comprising a first repeat unit of general formula (III) and a second repeat unit of general formula (IV):

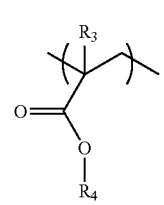

(III)

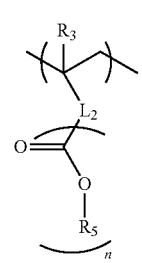

(IV)

wherein: $R_3$ independently represents H, F or optionally fluorinated C1 to C4 alkyl; $R_4$ represents linear, branched or cyclic C1 to C20 alkyl; $R_5$ represents linear, branched or cyclic C1 to C20 fluoroalkyl; $L_2$ represents a single bond or a multivalent linking group; and n is an integer of from 1 to 5; and a solvent. Coated substrates coated with the described topcoat compositions and methods of processing a photoresist composition are also provided. The invention finds particular applicability in the manufacture of semiconductor devices.

13 Claims, No Drawings

Related U.S. Application Data

(60) Provisional application No. 62/415,468, filed on Oct. 31, 2016.

(51) Int. Cl.
| | | |
|---|---|---|
| *G03F 7/038* | (2006.01) | |
| *B05C 11/08* | (2006.01) | |
| *G03F 7/00* | (2006.01) | |
| *G03F 7/16* | (2006.01) | |
| *H01L 21/027* | (2006.01) | |
| *G03F 7/40* | (2006.01) | |
| *G03F 7/38* | (2006.01) | |
| *G03F 7/20* | (2006.01) | |

(52) U.S. Cl.
 CPC ............. *G03F 7/0387* (2013.01); *G03F 7/09* (2013.01); *G03F 7/162* (2013.01); *G03F 7/2041* (2013.01); *G03F 7/38* (2013.01); *G03F 7/40* (2013.01); *H01L 21/0274* (2013.01)

(58) Field of Classification Search
 USPC ...................... 430/271.1, 322, 325, 329, 331
 See application file for complete search history.

(56) References Cited

U.S. PATENT DOCUMENTS

| | | |
|---|---|---|
| 8,841,058 B2 | 9/2014 | Chang |
| 9,543,147 B2 | 1/2017 | Liu |
| 9,563,128 B2 | 2/2017 | Wang |
| 2007/0212646 A1 | 9/2007 | Gallagher et al. |
| 2008/0311530 A1 | 12/2008 | Allen et al. |
| 2009/0136878 A1 | 5/2009 | Kanna |
| 2009/0286087 A1 | 11/2009 | Tanaka |
| 2010/0168337 A1 | 7/2010 | Allen |
| 2010/0183976 A1 | 7/2010 | Wang et al. |
| 2012/0264053 A1 | 10/2012 | Wang |
| 2013/0115553 A1 | 5/2013 | Wang |
| 2014/0295348 A1 | 10/2014 | Wang |
| 2015/0323869 A1 | 11/2015 | Liu et al. |
| 2016/0130462 A1 | 5/2016 | Liu et al. |
| 2016/0333212 A1 | 11/2016 | Liu et al. |

OTHER PUBLICATIONS

Daniel P. Sanders, et al, "Self-segregating materials for immersion lithography", Advances in Resist Materials and Processing Technology XXV, Proceedings of the SPIE, 2008, pp. 692309-1-692309-12, vol. 6923.

U.S. Office Action dated Jan. 13, 2017 for U.S. Appl. No. 15/152,589.

PHOTORESIST TOPCOAT COMPOSITIONS AND METHODS OF PROCESSING PHOTORESIST COMPOSITIONS

FIELD OF THE INVENTION

This invention relates to photoresist topcoat compositions that may be applied above a photoresist composition. The invention finds particular applicability as a topcoat layer in an immersion lithography process for the formation of semiconductor devices.

BACKGROUND OF THE INVENTION

Photoresists are used for transferring an image to a substrate. A layer of a photoresist is formed on a substrate and the photoresist layer is then exposed through a photomask to a source of activating radiation. The photomask has areas that are opaque to the activating radiation and other areas that are transparent to the activating radiation. Exposure to activating radiation provides a photoinduced chemical transformation of the photoresist coating to thereby transfer the pattern of the photomask to the photoresist-coated substrate. Following exposure, the photoresist is baked and developed by contact with a developer solution to provide a relief image that permits selective processing of the substrate.

One approach to achieving nanometer (nm)-scale feature sizes in semiconductor devices is to use shorter wavelengths of light. However, the difficulty in finding materials that are transparent below 193 nm has led to the immersion lithography process to increase the numerical aperture of the lens by use of a liquid to focus more light into the film. Immersion lithography employs a relatively high refractive index fluid, typically water, between the last surface of an imaging device (e.g., KrF or ArF light source) and the first surface on the substrate, for example, a semiconductor wafer.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to ameliorate this problem, use of a topcoat layer over the photoresist layer as a barrier between the immersion fluid and underlying photoresist layer has been proposed. The use of topcoat layers in immersion lithography, however, presents various challenges. Topcoat layers can affect, for example, process window, critical dimension (CD) variation and resist profile depending on characteristics such as topcoat refractive index, thickness, acidity, chemical interaction with the resist and soaking time. In addition, use of a topcoat layer can negatively impact device yield due, for example, to micro-bridging defects which prevent proper resist pattern formation.

To improve performance of topcoat materials, the use of self-segregating topcoat compositions to form a graded topcoat layer has been proposed, for example, in *Self-Segregating Materials for Immersion Lithography*, Daniel P. Sanders et al., Advances in Resist Materials and Processing Technology XXV, Proceedings of the SPIE, Vol. 6923, pp. 692309-1-692309-12 (2008). A self-segregated topcoat would theoretically allow for a tailored material having desired properties at both the immersion fluid and photoresist interfaces, for example, an improved water receding contact angle at the immersion fluid interface and good developer solubility at the photoresist interface.

Topcoats exhibiting a low receding contact angle for a given scan speed can result in water mark defects. These defects are generated when water droplets are left behind as the exposure head moves across the wafer. As a result, resist sensitivity becomes altered due to leaching of resist components into the water droplets, and water can permeate into the underlying resist. Topcoats having high receding contact angles would therefore be desired to allow for operation of immersion scanners at greater scan speeds, thereby allowing for increased process throughput. U.S. Patent App. Pub. Nos. 2007/0212646A1 to Gallagher et al. and 2010/0183976A1 to Wang et al. describe immersion topcoat compositions that include a self-segregating surface active polymer which allow for improved water receding contact angles. With the desire for increasingly faster scan speeds on the exposure tool to allow for increased throughput, topcoat compositions having further improved receding contact angles are desired.

There is a continuing need in the art for topcoat compositions exhibiting high receding contact angles for use in immersion lithography, and for photolithographic methods making use of such materials.

SUMMARY OF THE INVENTION

In accordance with a first aspect of the invention, provided are photoresist topcoat compositions. The compositions comprise: a first polymer comprising a first repeat unit of general formula (I) and a second repeat unit of general formula (II):

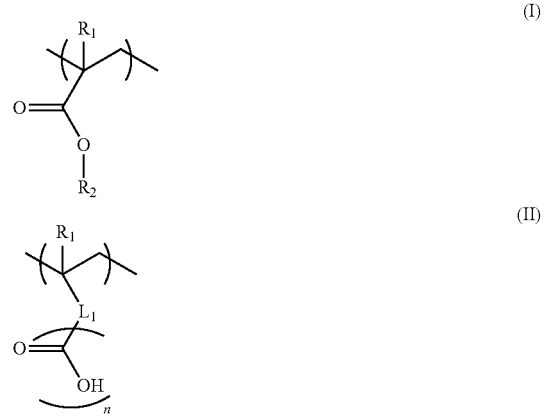

wherein: $R_1$ independently represents H, F or optionally fluorinated C1 to C4 alkyl; $R_2$ represents optionally fluorinated linear, branched or cyclic C1 to C20 alkyl; $L_1$ represents a single bond or a multivalent linking group; and n is an integer of from 1 to 5; a second polymer comprising a first repeat unit of general formula (III) and a second repeat unit of general formula (IV):

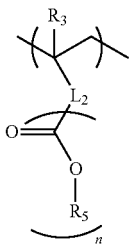

(IV)

wherein: $R_3$ independently represents H, F or optionally fluorinated C1 to C4 alkyl; $R_4$ represents linear, branched or cyclic C1 to C20 alkyl; $R_5$ represents linear, branched or cyclic C1 to C20 fluoroalkyl; $L_2$ represents a single bond or a multivalent linking group; and n is an integer of from 1 to 5; and a solvent.

In accordance with a further aspect of the invention, provided are coated substrates. The coated substrates comprise: a photoresist layer on a substrate; and a topcoat layer formed from a photoresist topcoat composition as described herein on the photoresist layer.

In accordance with a further aspect of the invention, provided are methods of processing a photoresist composition. The methods comprise: (a) applying a photoresist composition over a substrate to form a photoresist layer; (b) applying over the photoresist layer a photoresist topcoat composition as described herein to form a topcoat layer; (c) exposing the topcoat layer and the photoresist layer to activating radiation; and (d) contacting the exposed topcoat layer and photoresist layer with a developer to form a resist pattern.

DETAILED DESCRIPTION

The topcoat compositions of the invention comprise a matrix polymer, a surface active polymer, a solvent, and can include one or more additional, optional components. The surface active polymer has a lower surface energy than that of the matrix polymer and other polymers in the composition.

Topcoat compositions of the invention that are applied above a photoresist layer are self-segregating, and can minimize or prevent migration of components of the photoresist layer into an immersion fluid employed in an immersion lithography process. As used herein, the term "immersion fluid" means a fluid, typically water, interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

Topcoat compositions of the invention can allow for improvement in one or more of various water contact angle characteristics that are important in an immersion lithography process, for example, static contact angle, receding contact angle, advancing contact angle and sliding angle at the immersion fluid interface. The topcoat compositions provide topcoat layers having excellent developer solubility for both exposed and unexposed regions of the layer, for example, in an aqueous base developer.

The compositions can be used in dry lithography or more typically in immersion lithography processes. The exposure wavelength is not particularly limited except by the photoresist compositions, with 248 nm or sub 200 nm such as 193 nm or an EUV wavelength (e.g., 13.4 nm) being typical.

Polymers useful in the invention are preferably aqueous alkali soluble such that a topcoat layer formed from the composition can be removed in the resist development step using an aqueous alkaline developer, for example, a quaternary ammonium hydroxide solution, for example, tetramethylammonium hydroxide (TMAH). The different polymers suitably may be present in varying relative amounts.

The polymers of the topcoat compositions of the invention may contain a variety of repeat units, including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the polymers will depend, for example, on the intended functionality of the polymer.

One or more polymers of the topcoat composition can comprise one or more groups that are reactive during lithographic processing, for example, one or more photoacid-labile groups that can undergo cleavage reactions in the presence of acid and heat, such as acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound. The presence of such groups can render the associated polymer(s) more soluble in a developer solution, thereby aiding in developability and removal of the topcoat layer during a development process.

The polymers can advantageously be selected to tailor characteristics of the topcoat layer, with each generally serving one or more purpose or function. Such functions include, for example, one or more of photoresist profile adjusting, topcoat surface adjusting, reducing defects and reducing interfacial mixing between the topcoat and photoresist layers.

The matrix polymer comprises a repeat unit of general formula (I) and a repeat unit of general formula (II):

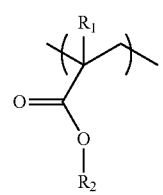

(I)

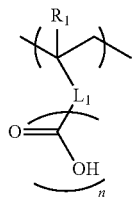

(II)

wherein: $R_1$ independently represents H, F or optionally fluorinated C1 to C4 alkyl, typically H or methyl; $R_2$ represents optionally fluorinated linear, branched or cyclic C1 to C20 alkyl, typically C1 to C12 alkyl; $L_1$ represents a single bond or a multivalent linking group chosen, for example, from optionally substituted aliphatic, such as C1 to C6 alkylene, and aromatic hydrocarbons, and combinations thereof, optionally with one or more linking moieties chosen from —O—, —S—, —COO— and —CONR— wherein R is chosen from hydrogen and optionally substituted C1 to C10 alkyl; and n is an integer of from 1 to 5, typically 1.

It is believed that units of general formula (I) allow for good solubility of the matrix polymer in the solvent used in the topcoat composition. Due to their highly polar nature, units of general formula (II) can impart desirable solubility characteristics to the matrix polymer in an aqueous base developer. This allows for effective removal during photoresist development.

Units of general formula (I) are typically present in the matrix polymer in an amount of from 1 to 90 mol %, typically from 50 to 80 mol %, based on the matrix polymer. Units of general formula (II) are typically present in the matrix polymer in an amount of from 1 to 90 mol %, typically, from 10 to 50 mol %, based on the matrix polymer.

Exemplary suitable monomers for forming units of general formula (I) include the following:

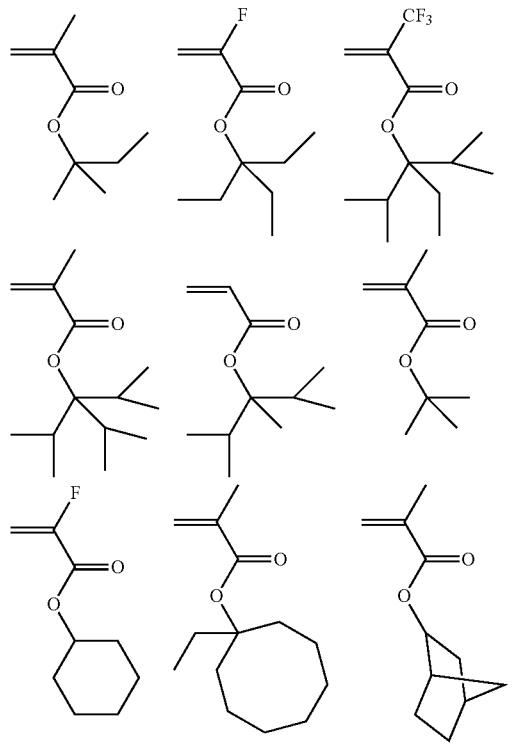

Exemplary suitable monomers for forming units of general formula (II) including the following:

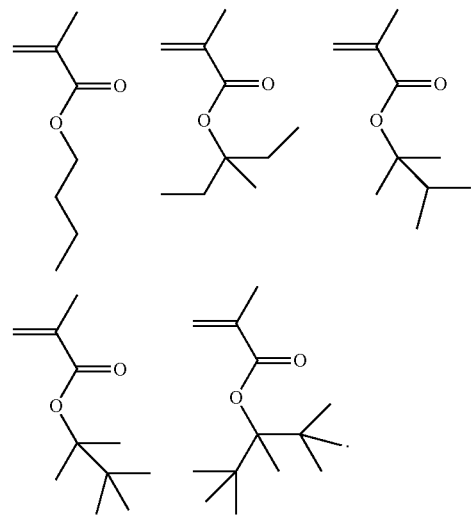

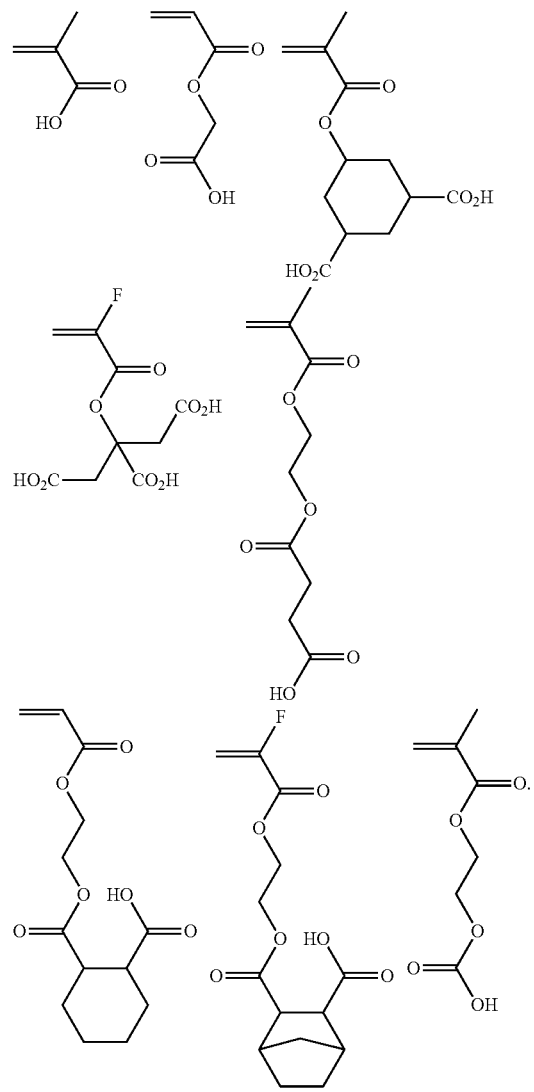

The matrix polymer may include one or more additional units of general formula (I), general formula (II) and/or an additional type of unit. The matrix polymer may, for example, include a unit containing a sulfonamide group (e.g., —NHSO$_2$CF$_3$), a fluoroalkyl group and/or a fluoroalcohol group (e.g., —C(CF$_3$)$_2$OH) for enhancing developer dissolution rate of the polymer. Additional types of units, if used, are typically present in the matrix polymer in an amount of from 1 to 40 mol % based on the matrix polymer.

The matrix polymer should provide a sufficiently high developer dissolution rate for reducing overall defectivity due, for example, to micro-bridging. A typical developer dissolution rate for the matrix polymer is greater than 300 nm/second, preferably greater than 1000 nm/second and more preferably greater than 3000 nm/second.

The matrix polymer preferably has a higher surface energy than that of, and is preferably substantially immiscible with, the surface active polymer, to allow the surface active polymer to phase separate from the matrix polymer and migrate to the upper surface of the topcoat layer away from the topcoat layer/photoresist layer interface. The surface energy of the matrix polymer is typically from 30 to 60 mN/m.

Exemplary matrix polymers in accordance with the invention include the following:

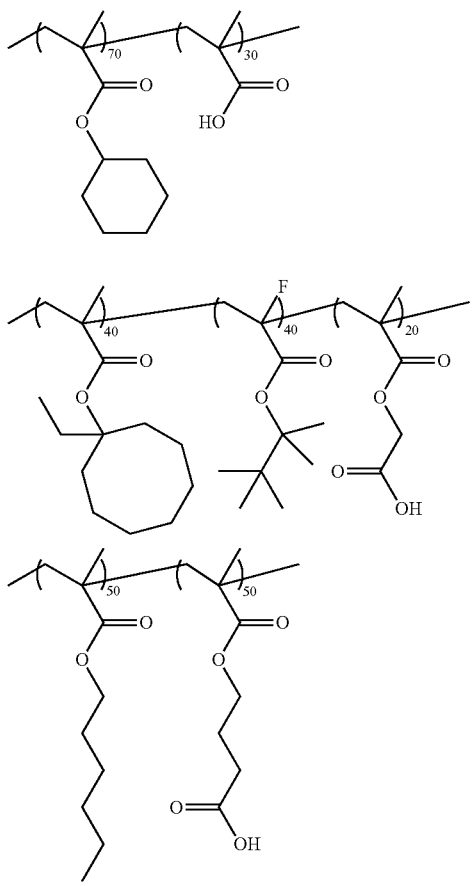

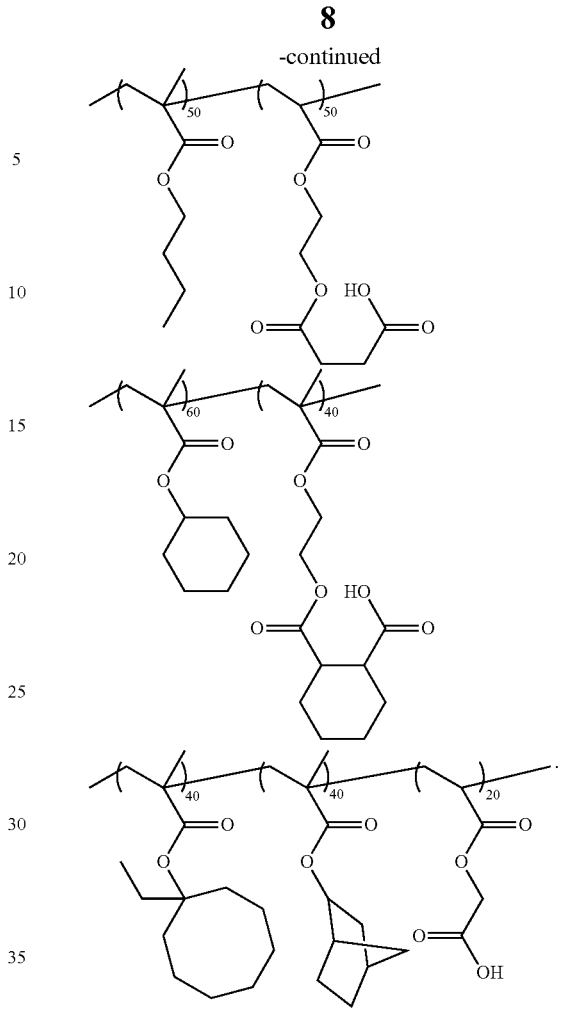

The matrix polymer is typically present in the compositions in an amount of from 70 to 99 wt %, more typically from 85 to 95 wt %, based on total solids of the topcoat composition. The weight average molecular weight of the matrix polymer is typically less than 400,000, for example, from 5000 to 50,000 or from 5000 to 25,000.

The surface active polymer is provided in the topcoat compositions to improve surface properties at the topcoat/immersion fluid interface in the case of an immersion lithography process. In particular, the surface active polymer beneficially can provide desirable surface properties with respect to water, for example, one or more of improved static contact angle (SCA), receding contact angle (RCA), advancing contact angle (ACA) and sliding angle (SA) at the topcoat layer/immersion fluid interface. In particular, the surface active polymers can allow for higher RCAs, which can allow for faster scanning speeds and increased process throughput. A layer of the topcoat composition in a dried state typically has a water receding contact angle of from 75 to 90°, and preferably from 80 to 90° and more preferably from 83 to 90°, for example, from 83 to 88°. The phrase "in a dried state" means containing 8 wt % or less of solvent, based on the entire topcoat composition.

The surface active polymer is preferably aqueous alkali soluble to allow for complete removal during development with an aqueous base developer. The surface active polymer is preferably free of carboxylic acid groups as such groups can reduce the receding contact angle properties of the polymer.

The surface active polymer has a lower surface energy than the matrix polymer. Preferably, the surface active polymer has a significantly lower surface energy than and is substantially immiscible with the matrix polymer, as well as other polymers present in the overcoat composition. In this way, the topcoat composition can be self-segregating, wherein the surface active polymer migrates to the upper surface of the topcoat layer apart from other polymer(s) during coating, typically spin-coating. The resulting topcoat layer is thereby rich in the surface active polymer at the topcoat layer upper surface at the topcoat/immersion fluid interface in the case of an immersion lithography process. The surface active polymer-rich surface region is typically from one to two or from one to three monolayers in thickness, or about 10 to 20 Å in thickness. While the desired surface energy of the surface active polymer will depend on the particular matrix polymer and its surface energy, the surface active polymer surface energy is typically from 15 to 35 mN/m, preferably from 18 to 30 mN/m. The surface active polymer is typically from 5 to 25 mN/m less than that of the matrix polymer, preferably from 5 to 15 mN/m less than that of the matrix polymer.

The surface active polymer comprises a repeat unit of general formula (III) and a repeat unit of general formula (IV):

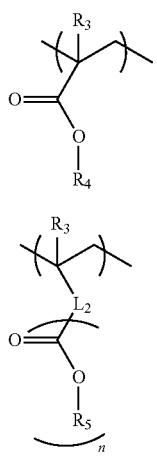

wherein: $R_3$ independently represents H, F or optionally fluorinated C1 to C4 alkyl, typically H or methyl; $R_4$ represents linear, branched or cyclic C1 to C20 alkyl, typically C1 to C12 alkyl; $R_5$ represents linear, branched or cyclic C1 to C20 fluoroalkyl, typically C1 to C12 fluoroalkyl; $L_2$ represents a single bond or a multivalent linking group chosen, for example, from optionally substituted aliphatic, such as C1 to C6 alkylene, and aromatic hydrocarbons, and combinations thereof, optionally with one or more linking moieties chosen from —O—, —S—, —COO— and —CONR— wherein R is chosen from hydrogen and optionally substituted C1 to C10 alkyl, $L_1$ preferably being —C(O)OCH$_2$—; and n is an integer of from 1 to 5, typically 1.

Units formed from monomers of general formula (III) containing an alkyl group are believed to impart beneficial hysteresis characteristics to the surface active polymer, for example, providing desirable water affinity and developer wetting properties. It is believed that monomers of general formula (IV) allow for effective phase separation of the surface active polymer from other polymers in the composition, enhanced dynamic contact angles, for example, increased receding angle and decreased sliding angle, as well as improving developer affinity and solubility.

Units of general formula (III) are typically present in the surface active polymer in an amount of from 1 to 90 mol %, for example, from 50 to 80 mol %, based on the surface active polymer. Units of general formula (IV) are typically present in the surface active polymer in an amount of from 1 to 90 mol %, for example, from 10 to 40 mol %, based on the surface active polymer.

Exemplary suitable monomers for the units of general formula (III) include the following:

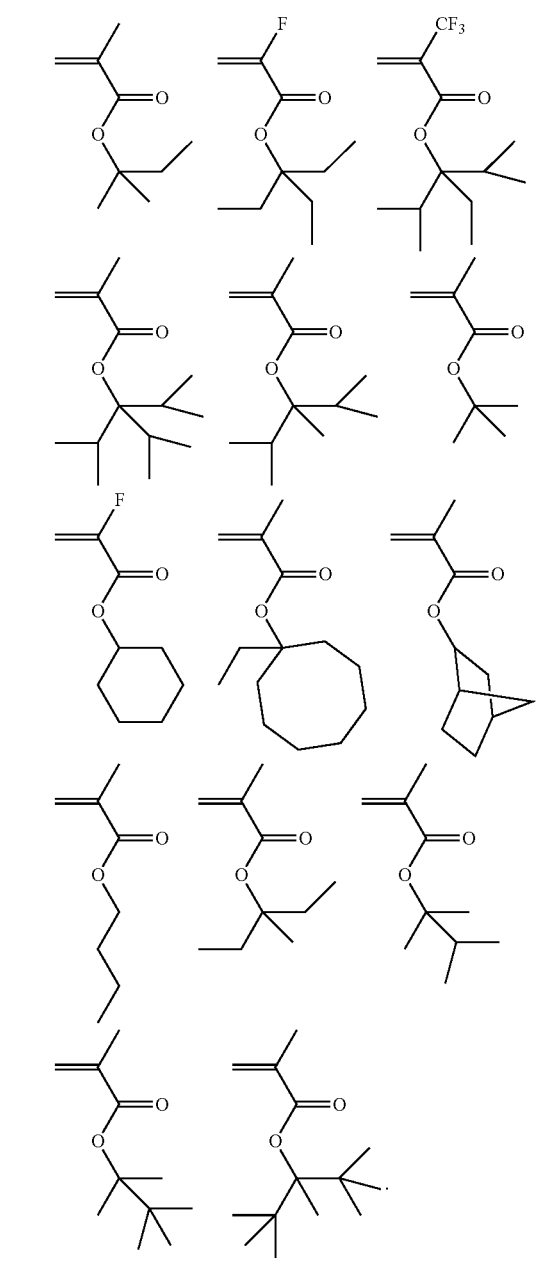

Exemplary suitable monomers for the units of general formula (IV) include the following:

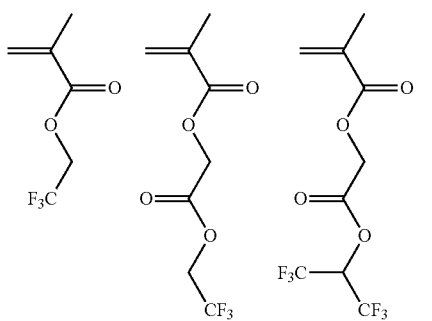
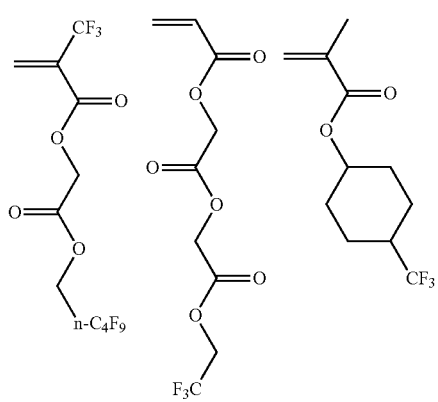
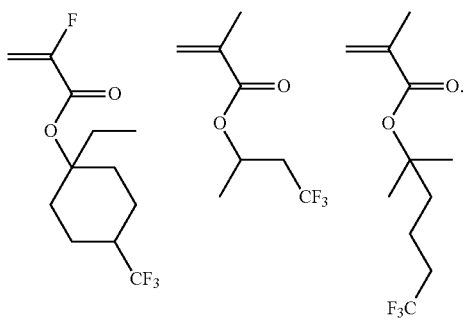

The surface active polymer may include one or more additional units of general formula (III), general formula (IV) and/or an additional type of unit. The surface active polymer can, for example, include one or more additional units comprising a fluorine-containing group, such as a fluorinated sulfonamide group, a fluorinated alcohol group, a fluorinated ester group, or a combination thereof, or an acid-labile leaving group, or a combination thereof. Fluoroalcohol group-containing units can be present in the surface active polymer for purposes of enhancing developer solubility, or to allow for enhanced dynamic contact angles, for example, increased receding angle and decreased sliding angle, and for improving developer affinity and solubility. Additional types of units, if used, are typically present in the surface active polymer in an amount of from 1 to 70 mol % based on the surface active polymer.

Exemplary polymers useful as the surface active polymer include, for example, the following:

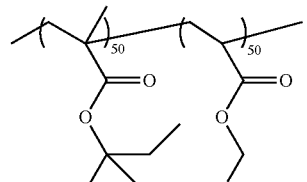
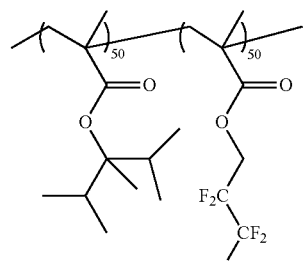
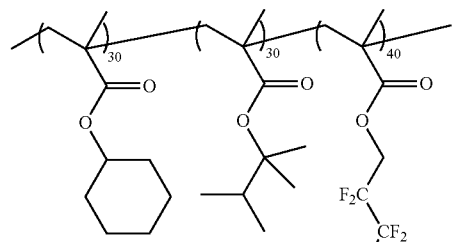
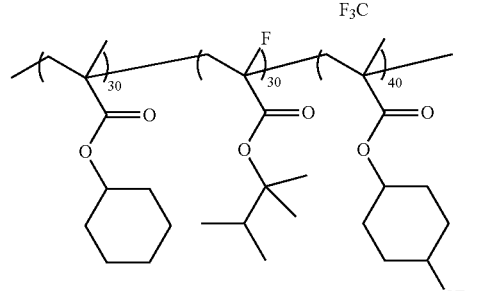
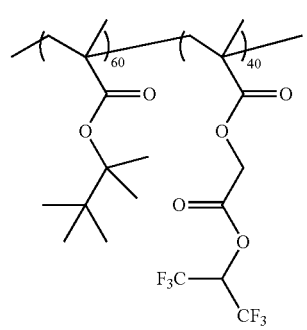
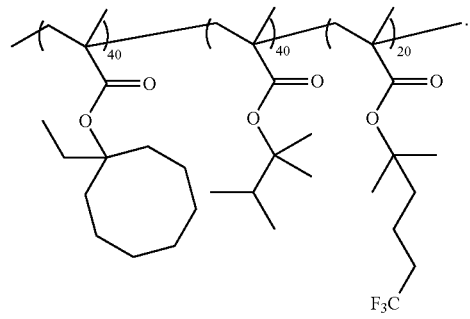

The lower content limit for the surface active polymer for immersion lithography is generally dictated by the need to prevent leaching of the photoresist components. The surface active polymer is typically present in the compositions in an amount of from 1 to 30 wt %, more typically from 3 to 20 wt % or 5 to 15 wt %, based on total solids of the topcoat composition. The weight average molecular weight of the surface active polymer is typically less than 400,000, preferably from 5000 to 50,000, more preferably from 5000 to 25,000.

Optional additional polymers can be present in the topcoat compositions. An additive polymer can, for example, be provided in addition to the matrix polymer and the surface active polymer for purposes of tuning the resist feature profile and/or for controlling resist top loss. The additive polymer should be miscible with the matrix polymer, and substantially immiscible with the surface active polymer such that the surface active polymer can self-segregate from the additive polymer to the topcoat surface away from the topcoat/photoresist interface.

Preferred additive polymers comprises a repeat unit of general formula (V) and a repeat unit of general formula (VI):

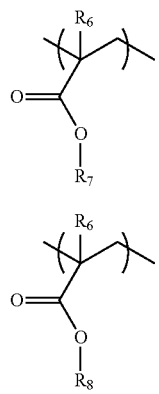

wherein: $R_6$ independently represents H, F, and optionally fluorinated C1 to C4 alkyl, typically H or methyl; $R_7$ represents linear, branched or cyclic C1 to C20 alkyl, typically C1 to C12 alkyl; and $R_8$ represents a linear, branched or cyclic C1 to C20 fluoroalkyl, typically C1 to C12 fluoroalkyl.

Units of general formula (V) are typically present in the additive polymer in an amount of from 1 to 90 mol %, for example, from 50 to 80 mol %, based on the additive polymer, and units of general formula (VI) are typically present in the additive polymer in an amount of from 1 to 90 mol %, for example, from 50 to 80 mol %, based on the additive polymer.

Exemplary suitable monomers for the units of general formula (V) include the following:

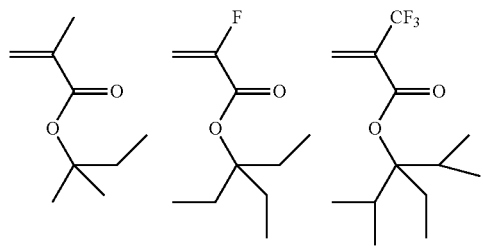

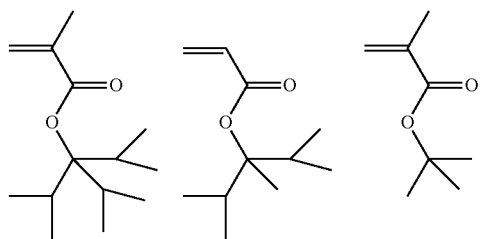

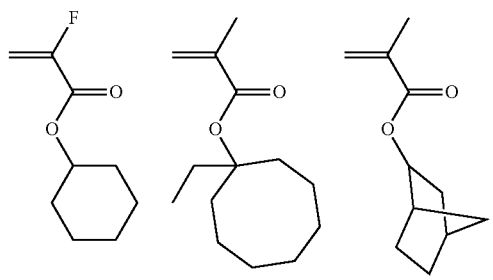

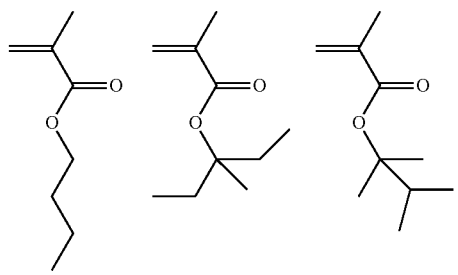

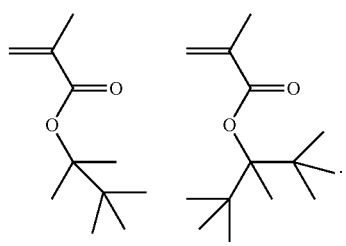

Exemplary suitable monomers for the units of general formula (VI) include the following:

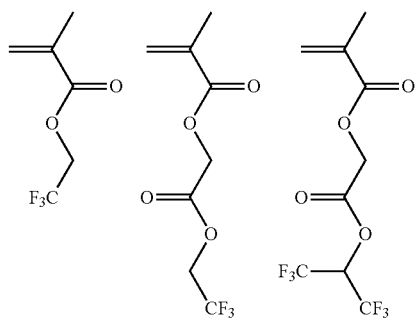

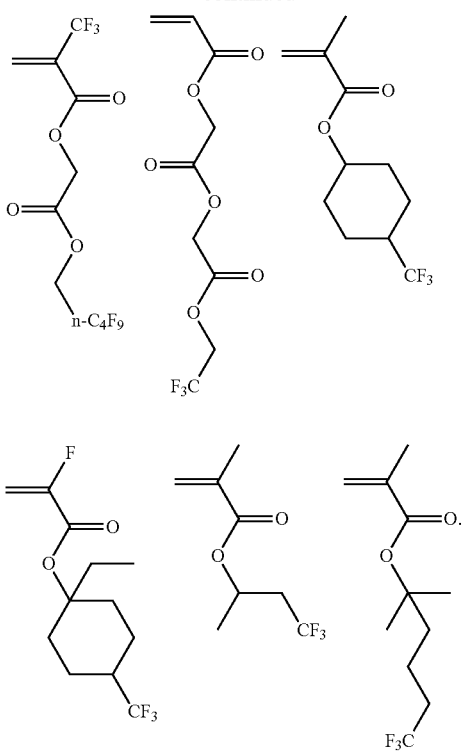

The additive polymer, if used, is typically present in the compositions in an amount of from 1 to 40 wt %, more typically from 3 to 20 wt % or 5 to 15 wt %, based on total solids of the topcoat composition. The weight average molecular weight of the additive polymer is typically less than 400,000, preferably from 5000 to 50,000, more preferably from 5000 to 25,000.

Exemplary polymers useful as the additive polymer include, for example, the following:

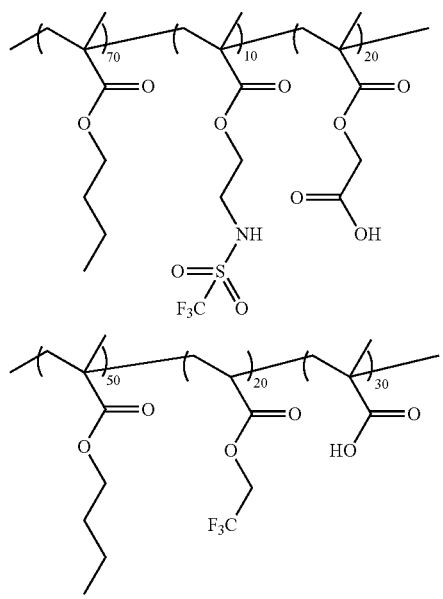

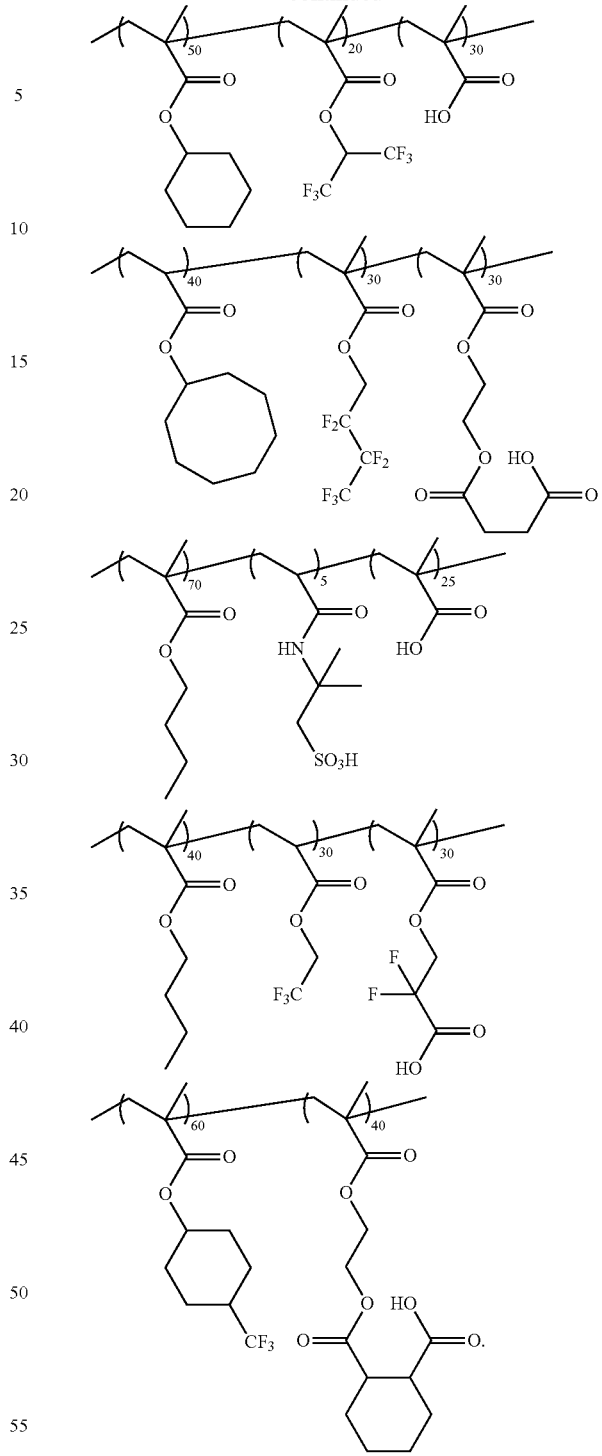

Typical solvent materials to formulate and cast a topcoat composition are any which dissolve or disperse the components of the topcoat composition but do not appreciably dissolve an underlying photoresist layer. Preferably, a mixture of different solvents, for example, two, three or more solvents, can be used to achieve effective phase separation of the segregating, surface active polymer from other polymer(s) in the composition. A solvent mixture can also be effective to reduce the viscosity of the formulation which allows for reduction in the dispense volume.

In an exemplary aspect, a two-solvent system or a three-solvent system can be used in the topcoat compositions of the invention. A preferred solvent system includes a primary solvent and an additive solvent, and may include a thinner solvent. The primary solvent typically exhibits excellent solubility characteristics with respect to the non-solvent components of the topcoat composition. While the desired boiling point of the primary solvent will depend on the other components of the solvent system, the boiling point is typically less than that of the additive solvent, with a boiling point of from 120 to 140° C. such as about 130° C. being typical. Suitable primary solvents include, for example, C4 to C10 monovalent alcohols, such as n-butanol, isobutanol, 2-methyl-1-butanol, isopentanol, 2,3-dimethyl-1-butanol, 4-methyl-2-pentanol, isohexanol, isoheptanol, 1-octanol, 1-nonanol and 1-decanol, and mixtures thereof. The primary solvent is typically present in an amount of from 30 to 80 wt % based on the solvent system.

The additive solvent can facilitate phase separation between the surface active polymer and other polymer(s) in the topcoat composition to facilitate a self-segregating topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers such as those of the formula:

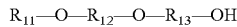

wherein $R_{11}$ is an optionally substituted C1 to C2 alkyl group and $R_{12}$ and $R_{13}$ are independently chosen from optionally substituted C2 to C4 alkyl groups, and mixtures of such hydroxy alkyl ethers including isomeric mixtures. Exemplary hydroxy alkyl ethers include dialkyl glycol mono-alkyl ethers and isomers thereof, for example, diethylene glycol monomethyl ether, dipropylene glycol monomethyl ether, isomers thereof and mixtures thereof. The additive solvent is typically present in an amount of from 3 to 15 wt % based on the solvent system.

A thinner solvent can be used to lower the viscosity and improve coating coverage at a lower dispensing volume. The thinner solvent is typically a poorer solvent for the non-solvent components of the composition relative to the primary solvent. While the desired boiling point of the thinner solvent will depend on the other components of the solvent system, a boiling point of from 140 to 180° C. such as about 170° C. is typical. Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_{14}$—O—$R_{15}$, wherein $R_{14}$ and $R_{15}$ are independently chosen from C2 to C8 alkyl, C2 to C6 alkyl and C2 to C4 alkyl. The alkyl ether groups can be linear or branched, and symmetric or asymmetric. Particularly suitable alkyl ethers include, for example, isobutyl ether, isopentyl ether, isobutyl isohexyl ether, and mixtures thereof. Other suitable thinner solvents include ester solvents, for example, those represented by general formula (VII):

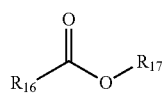

(VII)

wherein: $R_{16}$ and $R_{17}$ are independently chosen from C3 to C8 alkyl; and the total number of carbon atoms in $R_{16}$ and $R_{17}$ taken together is greater than 6. Suitable such ester solvents include, for example, propyl pentanoate, isopropyl pentanoate, isopropyl 3-methylbutanoate, isopropyl 2-methylbutanoate, isopropyl pivalate, isobutyl isobutyrate, 2-methylbutyl isobutyrate, 2-methylbutyl 2-methylbutanoate, 2-methylbutyl 2-methylhexanoate, 2-methylbutyl heptanoate, hexyl heptanoate, n-butyl n-butyrate, isoamyl n-butyrate and isoamyl isovalerate. The thinner solvent if used is typically present in an amount of from 10 to 70 wt % based on the solvent system.

A particularly preferred solvent system includes 4-methyl-2-pentanol, dipropylene glycol methyl ether and isobutyl isobutyrate. While the exemplary solvent system has been described with respect to two- and three-component systems, it should be clear that additional solvents may be used. For example, one or more additional primary solvents, thinner solvents, additive solvents and/or other solvents may be employed.

The topcoat compositions may comprise one or more other optional components. For example, the compositions can include one or more of actinic and contrast dyes for enhancing antireflective properties, anti-striation agents, and the like. Such optional additives if used are typically present in the composition in minor amounts such as from 0.1 to 10 wt % based on total solids of the overcoat composition.

It may be beneficial to include an acid generator compound such as a photoacid generator (PAG) compound in the topcoat compositions. Suitable photoacid generators are known in the art of chemically amplified photoresists and include, for example: onium salts, for example, triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used. If employed, the one or more acid generators may be utilized in relatively small amounts in a topcoat composition, for example, from 0.1 to 8 wt %, based on total solids of the composition. Such use of one or more acid generator compounds may favorably impact lithographic performance, particularly resolution, of the developed image patterned in an underlying resist layer.

Topcoat layers formed from the compositions typically have an index of refraction of 1.4 or greater at 193 nm, preferably 1.47 or greater at 193 nm. The index of refraction can be tuned by changing the composition of the matrix polymer, the surface active polymer, the additive polymer or other components of the overcoat composition. For example, increasing the relative amount of organic content in the overcoat composition may provide increased refractive index of the layer. Preferred overcoat composition layers will have a refractive index between that of the immersion fluid and the photoresist at the target exposure wavelength.

The photoresist topcoat compositions can be prepared following known procedures. For example, the compositions can be prepared by dissolving solid components of the composition in the solvent components. The desired total solids content of the compositions will depend on factors such as the particular polymers in the composition and desired final layer thickness. Preferably, the solids content of the overcoat compositions is from 1 to 10 wt %, more preferably from 1 to 5 wt %, based on the total weight of the composition. The viscosity of the entire composition is typically from 1.5 to 2 centipoise (cp).

Photoresists

Photoresist compositions useful in the invention include chemically-amplified photoresist compositions comprising a matrix polymer that is acid-sensitive, meaning that as part of a layer of the photoresist composition, the polymer and composition layer undergo a change in solubility in a developer as a result of reaction with acid generated by a photoacid generator following softbake, exposure to activating radiation and post exposure bake. The resist formulation can be positive-acting or negative-acting, but is typically positive-acting. In positive-type photoresists, the change in solubility is typically brought about when acid-labile groups such as photoacid-labile ester or acetal groups in the matrix polymer undergo a photoacid-promoted deprotection reaction on exposure to activating radiation and heat treatment. Suitable photoresist compositions useful for the invention are commercially available For imaging at wavelengths such as 193 nm, the matrix polymer is typically substantially free (e.g., less than 15 mole %) or completely free of phenyl, benzyl or other aromatic groups where such groups are highly absorbing of the radiation. Suitable polymers that are substantially or completely free of aromatic groups are disclosed in European application EP930542A1 and U.S. Pat. Nos. 6,692,888 and 6,680,159, all of the Shipley Company. Preferable acid-labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t-butyl acrylate, t-butyl methacrylate, methyladamantyl acrylate, methyladamantyl methacrylate, ethylfenchyl acrylate, ethylfenchyl methacrylate, and the like, and other non-cyclic alkyl and alicyclic (alkyl)acrylates. Such polymers have been described, for example, in U.S. Pat. No. 6,057,083, European Published Applications EP01008913A1 and EP00930542A1, and U.S. Pat. No. 6,136,501. Other suitable matrix polymers include, for example, those which contain polymerized units of a non-aromatic cyclic olefin (endocyclic double bond) such as an optionally substituted norbornene, for example, polymers described in U.S. Pat. Nos. 5,843,624 and 6,048,664. Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a heteroatom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable heteroatom group-containing matrix polymers include polymers that contain polymerized carbocyclic aryl units substituted with one or more heteroatom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions.

Suitable matrix polymers for use in the photoresist compositions are commercially available and can be readily made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoactive component such as a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials. Suitable PAGs are known in the art of chemically amplified photoresists and include, for example, those described above with respect to the topcoat composition.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases are known in the art and include, for example, linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl) amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is suitably used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the solid components of the photoresist in the solvent component. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Lithographic Processing

Liquid photoresist compositions can be applied to a substrate such as by spin-coating, dipping, roller-coating or other conventional coating technique, with spin-coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in the methods of the invention are suitably applied to a substrate in a conventional manner for applying photoresists. For example, the compositions may be applied over silicon wafers or silicon wafers coated with one or more layers and having features on a surface for the production of microprocessors or other integrated circuit components. Aluminum-aluminum oxide, gallium arsenide, ceramic, quartz, copper, glass substrates and the like may also be suitably employed. The photoresist compositions are typically applied over an antireflective layer, for example, an organic antireflective layer.

A topcoat composition of the invention can be applied over the photoresist composition by any suitable method such as described above with reference to the photoresist compositions, with spin-coating being typical.

Following coating of the photoresist onto a surface, it may be heated (softbaked) to remove the solvent until typically the photoresist coating is tack free, or the photoresist layer may be dried after the topcoat composition has been applied and the solvent from both the photoresist composition and topcoat composition layers substantially removed in a single thermal treatment step.

The photoresist layer with overcoated topcoat layer is then exposed through a patterned photomask to radiation activating for the photoactive component of the photoresist. The exposure is typically conducted with an immersion scanner but can alternatively be conducted with a dry (non-immersion) exposure tool.

During the exposure step, the photoresist composition layer is exposed to patterned activating radiation with the exposure energy typically ranging from about 1 to 100 mJ/cm², dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

The photoresist composition (and topcoat composition if photosensitive) is typically photoactivated by a short exposure wavelength, for example, radiation having a wavelength of less than 300 nm such as 248 nm, 193 nm and EUV wavelengths such as 13.5 nm. Following exposure, the layer of the composition is typically baked at a temperature ranging from about 70° C. to about 160° C.

Thereafter, the film is developed, typically by treatment with an aqueous base developer chosen, for example, from: quaternary ammonium hydroxide solutions such as a tetra-alkyl ammonium hydroxide solutions, typically a 0.26 N tetramethylammonium hydroxide; amine solutions such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist layer, the developed substrate may be selectively processed on those areas bared of resist, for example by chemically etching or plating substrate areas bared of resist in accordance with procedures known in the art. After such processing, the resist remaining on the substrate can be removed from the using known stripping procedures.

The following non-limiting examples are illustrative of the invention.

EXAMPLES

Number and weight-average molecular weights, Mn and Mw, and polydispersity values, Mw/Mn or PDI, were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 m syringe filter before injection through the GPC column. A flow rate of 1 mL/min and temperature of 35° C. were maintained. The columns were calibrated with narrow molecular weight PS standards (EasiCal PS-2, Polymer Laboratories, Inc.).

Polymer Synthesis and Characterization

The following monomers were used to prepare matrix polymers, surface active polymers and additive polymers for topcoat compositions as described below:

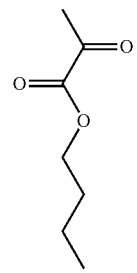

M1

-continued

M2
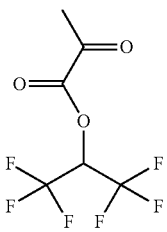

M3
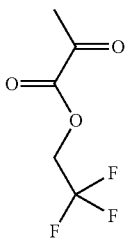

M4
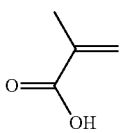

M5
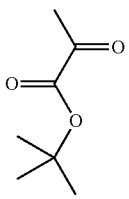

M6
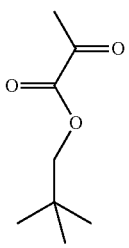

M7
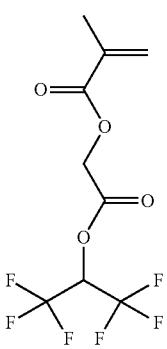

M8
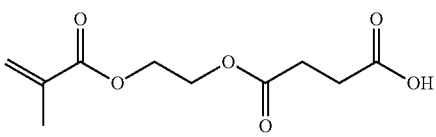

Matrix Polymer (MP) Synthesis

A monomer feed solution was prepared by combining 10 g 4-methyl-2-pentanol (4M2P), 6 g monomer M1 and 4 g monomer M4 in a container, and agitating the mixture to dissolve the two monomers. An initiator feed solution was prepared by combining 0.61 g Wako V-601 initiator and 6.2 g 4M2P in a suitable container and agitating the mixture to dissolve the initiator. 13.3 g 4M2P was introduced into a reaction vessel and the vessel was purged with nitrogen for 30 minutes. The reaction vessel was next heated to 88° C. with agitation. Introduction of the monomer feed solution and initiator feed solution into the reaction vessel was simultaneously started. The monomer feed solution was fed over a period of 1.5 hours and the initiator feed solution over a period of two hours. The reaction vessel was maintained at 88° C. for an additional three hours with agitation, and then allowed to cool to room temperature. Polymer MP4 [Mw=13.6 kDa and PID=2.4] was thereby formed.

Polymers MP1 to MP3 were synthesized employing a procedure similar to that used for MP4, using the monomers and amounts (as mole fractions) set forth in Table 1.

TABLE 1

| Matrix Polymer | M1 | M2 | M3 | M4 | Mw | PDI | DR Å/s |
|---|---|---|---|---|---|---|---|
| MP1 | 25 | 21 |  | 54 | 13K | 2.8 | 36,620 |
| MP2 |  |  | 43 | 57 | 17.6K | 3.0 | 43,180 |
| MP3 | 25 |  | 21 | 54 | 19.6K | 2.5 | 36,720 |
| MP4 | 48 |  |  | 52 | 13.6K | 2.4 | 36,660 |

Surface Active Polymer (SAP) and Additive Polymer (AP) Synthesis

A monomer feed solution was prepared by combining 57.1 g monomer M5, 50.7 g monomer M7 and 15.1 g propylene glycol monomethyl ether acetate (PGMEA) in a container. The mixture was agitated to dissolve the monomers. An initiator feed solution was prepared by combining 3.9 g Wako V-601 initiator (E. I. du Pont de Nemours and Company) and 34.9 g PGMEA in a container. The mixture was agitated to dissolve the initiator. 54.0 g PGMEA was introduced into a reaction vessel and the vessel was purged with nitrogen for 30 minutes. The reaction vessel was next heated to 99° C. with agitation. The monomer feed solution and initiator feed solution were simultaneously introduced into the reaction vessel for a period of two hours. The reaction vessel was maintained at 99° C. for an additional two hours. The reaction mixture was then allowed to cool to room temperature. Polymer SAP1 [Mn=11.7 kDa and PDI=2.0] was thereby formed.

Polymers SAP2 to SAP-3 and API to AP7 were synthesized employing a procedure similar to that used for Polymer SAP1, using the monomers and amounts (as mole fractions) set forth in Table 2 for the Surface Active Polymers and in Table 3 for the Additive Polymers.

TABLE 2

| Surface Active Polymer | M2 | M4 | M5 | M6 | M7 | Mw | PDI | DR Å/s |
|---|---|---|---|---|---|---|---|---|
| SAP1 |  |  | 70 |  | 30 | 11.7K | 2.0 | 0 |
| SAP2 | 30 |  | 70 |  |  | 9K | 1.7 | 0 |
| SAP3 | 30 |  |  | 70 |  | 13.5K | 1.7 | 0 |

TABLE 3

| Additive Polymer | M2 | M4 | M5 | M6 | M8 | Mw | PDI | DR Å/s |
|---|---|---|---|---|---|---|---|---|
| AP1 | 24 | 18 | 58 | | | 10.4K | 1.8 | 0.05 |
| AP2 | 26 | 22 | 52 | | | 11.2K | 1.9 | 35 |
| AP3 | 25 | | | 57 | 18 | 10.8K | 2.0 | 43 |
| AP4 | 18 | | | 57 | 25 | 12.1K | 2.1 | 360 |

Dissolution Rate Measurements

On a TEL ACT-8 wafer track, 8-inch silicon wafers were primed with HMDS at 120° C. for 30 seconds, coated with a 14 wt % solution of a respective matrix, surface active or additive polymer in PGMEA and softbaked at 90° C. for 60 seconds. Dissolution rate (DR) was measured in MF™-312 TMAH developer (Rohm and Haas Electronic Materials) at 22° C. on an LTJ ARM-808EUV dissolution rate monitor at 470 nm wavelength. The results are shown in Tables 1-3.

Topcoat Composition Preparation and Characterization

Topcoat compositions were prepared by admixing the components in the amounts set forth in Table 4. The compositions were filtered through 0.2 m PTFE disk filters prior to use.

TABLE 4

| Ex. | MP | SAP | AP | Acid | PAG | 4M2P | IBIB | DPM | RCA |
|---|---|---|---|---|---|---|---|---|---|
| 1 | MP1 1.334 | SAP1 0.185 | | A1 0.023 | 0.008 | 55.8 | 40.1 | 2.0 | 85.4 |
| 2 | MP2 1.334 | SAP1 0.185 | | A1 0.023 | 0.008 | 55.8 | 40.1 | 2.0 | 84.4 |
| 3 | MP3 1.334 | SAP1 0.185 | | | 0.008 | 55.8 | 40.1 | 2.0 | 85.3 |
| 4 | MP4 1.248 | SAP1 0.173 | | A1 0.022 | 0.007 | 55.9 | 40.2 | 2.0 | 85.9 |
| 5 | MP4 1.219 | SAP1 0.173 | | A1 0.044 | 0.014 | 56.1 | 40.3 | 2.0 | 84.7 |
| 6 | MP4 1.219 | SAP2 0.173 | | | 0.014 | 56.1 | 40.3 | 2.0 | 87.2 |
| 7 | MP4 1.219 | SAP2 0.052 | AP1 0.121 | A1 0.044 | 0.014 | 56.1 | 40.3 | 2.0 | 83.5 |
| 8 | MP4 1.219 | SAP2 0.052 | AP2 0.121 | A1 0.044 | 0.014 | 56.1 | 40.3 | 2.0 | 81.1 |
| 9 | MP4 1.340 | SAP3 0.052 | | A1 0.044 | 0.014 | 56.1 | 40.3 | 2.0 | 83.1 |
| 10 | MP4 1.219 | SAP3 0.052 | AP3 0.121 | A1 0.044 | 0.014 | 56.1 | 40.3 | 2.0 | 85.4 |
| 11 | MP4 1.219 | SAP3 0.052 | AP4 0.121 | | 0.014 | 56.1 | 40.3 | 2.0 | 85.4 |
| Comp. Ex. 1 | MP4 1.392 | | | | 0.014 | 56.1 | 40.3 | 2.0 | 33.0 |
| Comp. Ex. 2 | MP4 1.219 | | AP2 0.173 | | 0.014 | 56.1 | 40.3 | 2.0 | 66.1 |

MP = Matrix Polymer;
SAP = Surface Active Polymer (25-50 wt % in PGMEA; mass values are based on polymer only);
AP = Additive Polymer;
A1 = camphorsulfonic acid;
PAG = (4-(2-(tert-butoxy)-2-oxoethoxy)phenyl)diphenylsulfonium 1,1,2,2,3,3,4,4,4-nonafluorobutane-1-sulfonate;
4M2P = 4-Methyl-2-Pentanol;
DPM = Dipropylene Glycol Methyl Ether;
IBIB = Isobutyl Isobutyrate;
PGMEA = Propylene Glycol Monomethyl Ether Acetate; and
RCA = Receding Contact Angle.
RCA value units are degrees (°).
All other value units are in grams (g).

Contact Angle Measurement

On a TEL ACT-8 wafer track, 8-inch silicon wafers were primed with hexamethyldisilazane (HMDS) at 120° C. for 30 seconds, coated with 385 Å of a respective topcoat composition and softbaked at 90° C. for 60 seconds. The receding contact angle (RCA) for each of the topcoat compositions was measured on a Kruss contact angle goniometer using deionized Millipore filtered water. Dynamic contact angle measurements were carried out with 50 μL drop size and a tilt speed of 1 unit/sec. RCA was measured at the beginning of lateral drop motion before rapid acceleration. The results are shown in Table 4. The data in Table 2 show that topcoat receding contact angle (RCA) above 81 degrees were achieved with the topcoat compositions of the invention.

Immersion Lithography

Twelve-inch silicon wafers were spin-coated with AR™26N antireflectant (Rohm and Haas Electronic Materials) to form a first bottom antireflective coating (BARC) on a TEL CLEAN TRAC LITHIUS i+ coater/developer. The wafers were baked for 60 seconds at 205° C., yielding a first BARC film thickness of 760 Å. A second BARC layer was formed over the first BARC by spin-coating AR™137 antireflectant (Rohm and Haas Electronic Materials), followed by baking at 205° C. for 60 seconds to generate a 200 Å top BARC layer. EPIC™ 2096 positive photoresist (Rohm and Haas Electronic Materials) was coated on the dual BARC-coated wafers and soft-baked at 120° C. for 60 seconds on a TEL CLEAN TRACK LITHIUS i+ coater/developer to provide a resist layer thickness of 1100 Å. Topcoat compositions of the examples were coated over the photoresist layer and soft-baked at 90° C. for 60 seconds on a TEL CLEAN TRACK LITHIUS i+ coater/developer to provide an overcoat thickness of 385 Å. The wafers were exposed through a mask on an ASML TWINSCAN XT: 1900i immersion scanner using dipole (35-Y) illumination with 1.35 NA, 0.96 outer sigma, 0.76 inner sigma, X polarization and 42 nm 1:1 line space patterns. The exposed wafers were post-exposure baked at 90° C. for 60 seconds and developed with TMAH developer (2.38%) on a TEL CLEAN TRACK™ LITHIUS™ i+ coater/developer to form resist patterns.

What is claimed is:

1. A photoresist topcoat composition, comprising:
a first polymer comprising a first repeat unit of general formula (I) and a second repeat unit of general formula (II):

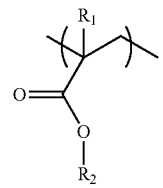

(I)

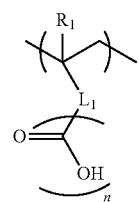

(II)

wherein: $R_1$ independently represents H, F or optionally fluorinated C1 to C4 alkyl; R2 represents optionally fluorinated linear, branched or cyclic C1 to C20 alkyl; $L_1$ represents a single bond or a multivalent linking group; and n is an integer of from 1 to 5;

a second polymer comprising a first repeat unit of general formula (III) and a second repeat unit of general formula (IV), wherein the second polymer is free of carboxylic acid groups:

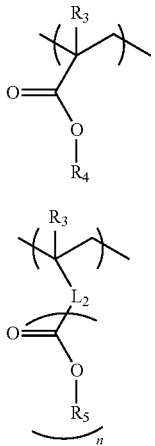

(III)

(IV)

wherein: $R_3$ independently represents H, F or optionally fluorinated C1 to C4 alkyl; $R_4$ represents linear, branched or cyclic C1 to C20 alkyl; $R_5$ represents linear, branched or cyclic C1 to C20 fluoroalkyl; $L_2$ represents a single bond or a multivalent linking group; and n is an integer of from 1 to 5;

a third polymer comprising a first repeat unit of the general formula (II), a second repeat unit of general formula (V) and a third repeat unit of general formula (VI):

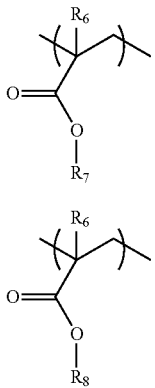

(V)

(VI)

wherein: $R_6$ independently represents H, F, and optionally fluorinated C1 to C4 alkyl; $R_7$ represents linear, branched or cyclic C1 to C20 alkyl; and $R_8$ represents a linear, branched or cyclic C1 to C20 fluoroalkyl; and a solvent.

2. The photoresist topcoat composition of claim 1, wherein $L_2$ represents —C(O)OCH$_2$—.

3. The photoresist topcoat composition of claim 1, wherein the composition comprises a solvent mixture.

4. The photoresist topcoat composition of claim 3, wherein the solvent mixture comprises: a first organic solvent chosen from C4 to C10 monovalent alcohols; and a second organic solvent represented by general formula (VII):

(VII)

wherein: $R_{16}$ and $R_{17}$ are independently chosen from C3 to C8 alkyl; and the total number of carbon atoms in $R_{16}$ and $R_{17}$ taken together is greater than 6.

5. A coated substrate, comprising:
a photoresist layer on a substrate; and
a topcoat layer formed from a photoresist topcoat composition of claim 1 on the photoresist layer.

6. The coated substrate of claim 5, wherein $L_2$ represents —C(O)OCH$_2$—.

7. The coated substrate of claim 5, wherein the composition comprises a solvent mixture.

8. The coated substrate of claim 7, wherein the solvent mixture comprises: a first organic solvent chosen from C4 to C10 monovalent alcohols; and a second organic solvent represented by general formula (VII):

(VII)

wherein: $R_{16}$ and $R_{17}$ are independently chosen from C3 to C8 alkyl; and the total number of carbon atoms in $R_{16}$ and $R_{17}$ taken together is greater than 6.

9. A method of processing a photoresist composition, comprising:
(a) applying a photoresist composition over a substrate to form a photoresist layer;
(b) applying over the photoresist layer a photoresist topcoat composition of claim 1 to form a topcoat layer;
(c) exposing the topcoat layer and the photoresist layer to activating radiation; and
(d) contacting the exposed topcoat layer and photoresist layer with a developer to form a resist pattern.

10. The method of claim 9, wherein the topcoat layer is formed by spin-coating, and the second polymer migrates to an upper surface of the topcoat layer during the spin-coating, wherein an upper surface of the topcoat layer consists essentially of the second polymer.

11. The method of claim 9, wherein $L_2$ represents —C(O)OCH$_2$—.

12. The method of claim 9, wherein the composition comprises a solvent mixture.

13. The method of claim 12, wherein the solvent mixture comprises: a first organic solvent chosen from C4 to C10 monovalent alcohols; and a second organic solvent represented by general formula (VII):

(VII)

wherein: $R_{16}$ and $R_{17}$ are independently chosen from C3 to C8 alkyl; and the total number of carbon atoms in $R_{16}$ and $R_{17}$ taken together is greater than 6.

* * * * *